United States Patent
Koike et al.

(10) Patent No.: US 8,580,688 B2
(45) Date of Patent: Nov. 12, 2013

(54) COPPER INTERCONNECTION STRUCTURE AND METHOD FOR FORMING COPPER INTERCONNECTIONS

(75) Inventors: Junichi Koike, Sendai (JP); Akihiro Shibatomi, Sendai (JP)

(73) Assignee: Advanced Interconect Materials, LLC, Sendai-shi (JP)

( * ) Notice: Subject to any disclaimer, the term of this patent is extended or adjusted under 35 U.S.C. 154(b) by 0 days.

(21) Appl. No.: 13/230,608

(22) Filed: Sep. 12, 2011

(65) Prior Publication Data

US 2012/0003390 A1  Jan. 5, 2012

Related U.S. Application Data

(62) Division of application No. 12/589,852, filed on Oct. 29, 2009, now Pat. No. 8,324,730.

(30) Foreign Application Priority Data

Dec. 19, 2008 (JP) .................................. 2008-324062

(51) Int. Cl.
*H01L 21/768* (2006.01)

(52) U.S. Cl.
USPC ........... 438/687; 438/618; 438/653; 257/751; 257/E23.141

(58) Field of Classification Search
USPC .............. 438/687, 618, 653; 257/751, 23.141
See application file for complete search history.

(56) References Cited

U.S. PATENT DOCUMENTS

| | | | |
|---|---|---|---|
| 7,507,666 B2 | 3/2009 | Nakao et al. | |
| 2005/0218519 A1* | 10/2005 | Koike et al. | 257/756 |
| 2008/0179747 A1* | 7/2008 | Sakai et al. | 257/751 |
| 2009/0096102 A1* | 4/2009 | Gambino et al. | 257/751 |
| 2010/0140802 A1* | 6/2010 | Matsumoto et al. | 257/741 |
| 2010/0320604 A1* | 12/2010 | Isobayashi | 257/751 |

FOREIGN PATENT DOCUMENTS

| | | |
|---|---|---|
| JP | H01-202841 A | 8/1989 |
| JP | H11-186273 A | 7/1999 |
| JP | 2000-068269 A | 3/2000 |
| JP | 2001-044156 A | 2/2001 |
| JP | 2004-266178 A | 9/2004 |
| JP | 2005-277390 A | 10/2005 |
| JP | 2007-48974 A | 2/2007 |
| JP | 2007-096241 A | 4/2007 |
| JP | 2007-059660 A | 3/2008 |
| JP | 2008-147467 A | 6/2008 |
| JP | 2008-187072 A | 8/2008 |
| WO | 2006/025347 A1 | 3/2006 |
| WO | 2007/100125 A1 | 9/2007 |
| WO | WO 2008/149844 * | 12/2008 |

OTHER PUBLICATIONS

S.M. Sze, Semiconductor Devices—Physics and Technology 2nd Edition, Oct. 5, 2005, pp. 346-347, 355-356 Sangyo Tosho, Japan.
"CBA Chemistry" translated by Bunichi Tamaushi, Feb. 20, 1971, published by Iwanami Shoten Publishers, second printing, p. 284.
F. M. Smits, The Bell System Technical Journal 37 (May 1958), pp. 711-718.

* cited by examiner

*Primary Examiner* — Zandra Smith
*Assistant Examiner* — Jamie C Niesz
(74) *Attorney, Agent, or Firm* — Sughrue Mion, PLLC

(57) ABSTRACT

A copper interconnection structure includes an insulating layer, an interconnection body including copper in an opening provided on the insulating layer, and a diffusion barrier layer formed between the insulating layer and the interconnection body. The diffusion barrier layer includes an oxide layer including manganese having a compositional ratio of oxygen to manganese (y/x) less than 2.

13 Claims, 5 Drawing Sheets

COPPER INTERCONNECTION STRUCTURE AND METHOD FOR FORMING COPPER INTERCONNECTIONS

This is a Divisional application of Ser. No. 12/589,852, filed in the United States Patent and Trademark Office on Oct. 29, 2009, which claims priority under 35 U.S.C. §119 from Japanese patent application serial No. 2008-324062, filed Dec. 19, 2008, entitled "Copper Interconnection, Semiconductor Device and Method for Forming Copper Interconnection", which is incorporated herein by reference in its entirety.

TECHNICAL FIELD

The present invention relates to a copper interconnection provided with an interconnection body made of copper on an insulating layer, a semiconductor device provided with the copper interconnection on the insulating layer as a circuit interconnection, and a method for forming the copper interconnection.

BACKGROUND OF THE INVENTION

Copper (Cu) has been used to form the main body of interconnection structures for semiconductor devices, such as silicon semiconductor devices, e.g. system LSI, flash memories, and large-size liquid crystal display devices (LCD) (refer to patent documents 1 to 3 below). Copper (Cu) has higher resistance for electro-migration (EM) or stress-migration (SM) compared to aluminum (Al), and is low in electric resistivity. For example, a technique has been disclosed to form a damascene type copper interconnection structure for silicon system LSIs which are used in Central Processing Units (CPU) (refer to non-patent document 1 below). This technique provides copper interconnections in that copper, which constitutes an interconnection body, is buried inside an interconnection hole, such as trench groove, via, or the like, provided on an interlayer insulating layer made of silicon dioxide ($SiO_2$).

[Patent document 1] Japanese unexamined patent application no. 2005-277390

[Patent document 2] International publication no. WO/2006-025347 A1

[Patent document 3] International publication no. WO/2007-100125 A1

[Non-Patent Document 1] "Semiconductor Device ($2^{nd}$ edition)—Physics and Technology" by S. M. Sze (ISBN4-7828-5550-8 C3055), Oct. 5, 2005, Sangyo Tosho, Co., Ltd., third impression of second edition, P. 355-356.

In single or dual damascene type copper interconnection structures, for example, it is common that the copper interconnection body is provided through a diffusion barrier layer, often referred to simply as "barrier layer" (refer to patent documents 4 to 6 below). The diffusion barrier layer prevents copper from intruding into the interlayer insulating layer so that it prevents a decrease in electric insulating property of the insulating layer. The barrier layer is structured from a thin layer formed from a material, such as tungsten nitride (WN) (refer to patent document 7 below), tantalum (Ta) and nitride or oxide of tantalum (TaN or $Ta_2O_5$) (refer to patent document 8 below), or rhenium (Re) (refer to patent document 9 below).

[Patent document 4] Japanese unexamined patent application publication no. H01-202841

[Patent document 5] Japanese unexamined patent application publication no. H11-186273

[Patent document 6] Japanese unexamined patent application publication no. 2001-44156

[Patent document 7] Japanese unexamined patent application publication no. 2000-068269

[Patent document 8] Japanese unexamined patent application publication no. 2004-266178

[Patent document 9] Japanese unexamined patent application publication no. 2007-096241

In recent years, several techniques are disclosed for forming the diffusion barrier layer. For example, as shown in Japanese Unexamined Patent Application no. 2005-277390 and in International Publication no. WO/2007-100125 A1, a technique is proposed for forming a diffusion barrier layer by using a film as a material. The film is made of solid solution or alloy of copper containing a metal element which has a diffusion coefficient higher than the self diffusion coefficient of copper and also features an oxide formation energy lower than that of copper. Further, another technique employing a copper manganese alloy is proposed for forming a barrier layer made of manganese dioxide ($MnO_2$)(refer to patent document 10 below). In this technique, the barrier layer is formed on a layer containing at least one metal element selected from a group of silver (Ag), zinc (Zn), cadmium (Cd), tin (Sn), aluminum (Al), chromium (Cr), palladium (Pd).

[Patent document 10] Japanese unexamined patent application publication no. 2007-96241

Additionally, a technique is disclosed for forming a diffusion barrier layer made from manganese silicon oxide, $MnSiO_3$ or $MnSi_3O_5$, using a copper layer containing manganese (Mn) as an alloying material by heat oxidation treatment (refer to patent document 1). By looking at the composition of the manganese oxide, which constitutes the conventional diffusion barrier layer, compositional ratios of oxide to manganese are 3 for $MnSiO_3$ and 5 for $MnSi_3O_5$. Moreover, a technique for providing a manganese oxide layer on an upper surface of copper constituting the copper interconnection body is disclosed. The manganese oxide layer is provided as a barrier layer for preventing copper oxidation. The barrier layer for preventing copper oxidation is made from MnO2 and is formed on the upper surface of the copper interconnection body (refer to patent document 11 below). In any of the above-mentioned barrier layer, the compositional ratio of oxygen to manganese, in the manganese oxide, is not less than 2.

[Patent document 11] Japanese unexamined patent application publication no. H11-186273

There is an advantage in forming easily a diffusion barrier layer using materials, such as a thin layer made of solid solution or ally of copper containing metal element. The metal element has a diffusion coefficient greater than the self diffusion coefficient of copper and has an enthalpy of oxide formation lower than that of copper. However, a problem still remains in that the copper interconnection having sufficient adhesiveness can not be stably formed on the diffusion barrier layer.

It is found that in the case where the interconnection body is formed on a diffusion barrier layer made of manganese oxide, the adhesiveness between the copper interconnection body and the diffusion barrier layer can not be secured sufficiently if the compositional ratio of oxygen against manganese in the manganese oxide is 2 or higher. This is because the four electrons involved in manganese bond are all used up for bonding with oxygen atoms and therefore there remains no electron for interacting with copper atoms.

The present invention is proposed in view of the above aforementioned problem. An objective of the present invention is to provide a copper interconnection, semiconductor device and method for forming the copper interconnection that are capable of significantly improving the adhesiveness between the diffusion barrier layer and the copper interconnection body.

SUMMARY OF THE INVENTION

In accordance with one aspect of the present invention, a copper interconnection structure includes:
an insulating layer;
an interconnection body including copper in an opening provided on the insulating layer; and
a diffusion barrier layer formed between the insulating layer and the interconnection body, wherein the diffusion barrier layer includes an oxide layer including manganese having a compositional ratio of oxygen to manganese (y/x) less than 2.

In the first aspect of the present invention, the diffusion barrier layer includes the oxide layer including manganese having the compositional ratio of oxygen to manganese (y/x) less than 2. According to this condition, the four electrons involved in manganese bond are not all used up for bonding with oxygen atoms and therefore there remain some electrons for interacting with copper atoms. Therefore, the adhesiveness between the diffusion barrier layer and the interconnection body is significantly improved.

In accordance with a second aspect of the present invention, a copper interconnection structure includes:
an insulating layer;
an interconnection body including copper in an opening provided on the insulating layer; and
a diffusion barrier layer formed between the insulating layer and the interconnection body, wherein the diffusion barrier layer includes:
  a first layer including a metal element other than manganese, wherein the first layer is formed on an inner surface of the opening facing the insulating layer, and
  a first oxide layer including manganese formed on the first layer having a compositional ratio of oxygen to manganese (y/x) less than 2.

In the second aspect of the present invention, the diffusion barrier layer includes the oxide layer including manganese having the compositional ratio of oxygen to manganese (y/x) less than 2. According to this condition, the four electrons involved in manganese bond are not all used up for bonding with oxygen atoms and therefore there remain some electrons for interacting with copper atoms. Therefore, the adhesiveness between the diffusion barrier layer and the interconnection body is significantly improved.

Further, the first oxide layer including manganese is formed on the first layer comprising a metal element other than manganese. Accordingly, oxygen of the insulting layer, which is mainly made of silicon oxide, can surely be prevented from diffusing or intruding into the first oxide layer including manganese, for example. Therefore, the first oxide layer including manganese having a compositional ratio of oxygen to manganese (y/x) less than 2 can be formed stably.

In accordance with a third aspect of the present invention, a method for forming a copper interconnection structure includes the steps of
forming an insulating layer over a main body;
forming a copper layer including manganese on the insulating layer;
annealing the copper layer including manganese so as to form a diffusion barrier layer, wherein the annealing step is applied:
in a vacuum atmosphere with a pressure of not more than 0.1 Pa or in an inert gas atmosphere including hydrogen with a volume percentage ranging from 2 vol. ppm to 30 vol. ppm, at temperatures ranging from 350° C. to 550° C., and
for a time period ranging from 5 to 80 minutes; and
depositing copper over the diffusion barrier layer so as to form an interconnection body.

In the third aspect of the present invention, the copper layer including manganese is annealed under the predetermined condition. According to this condition, a diffusion barrier layer including an oxide layer including manganese having a compositional ratio of oxygen to manganese (y/x) less than 2 is formed in the copper interconnection structure. In such a copper interconnection structure, the four electrons involved in manganese bond are not all used up for bonding with oxygen atoms and therefore there remain some electrons for interacting with copper atoms. Therefore, the adhesiveness between the diffusion barrier layer and the interconnection body is significantly improved.

Further areas of applicability of the present disclosure will become apparent from the detailed description provided hereinafter. It should be understood that the detailed description and specific examples, while indicating various embodiments, are intended for the purposes of illustration only and are not intended to necessarily limit the scope of the disclosure.

DETAILED DESCRIPTION OF THE INVENTION

Figure 1:
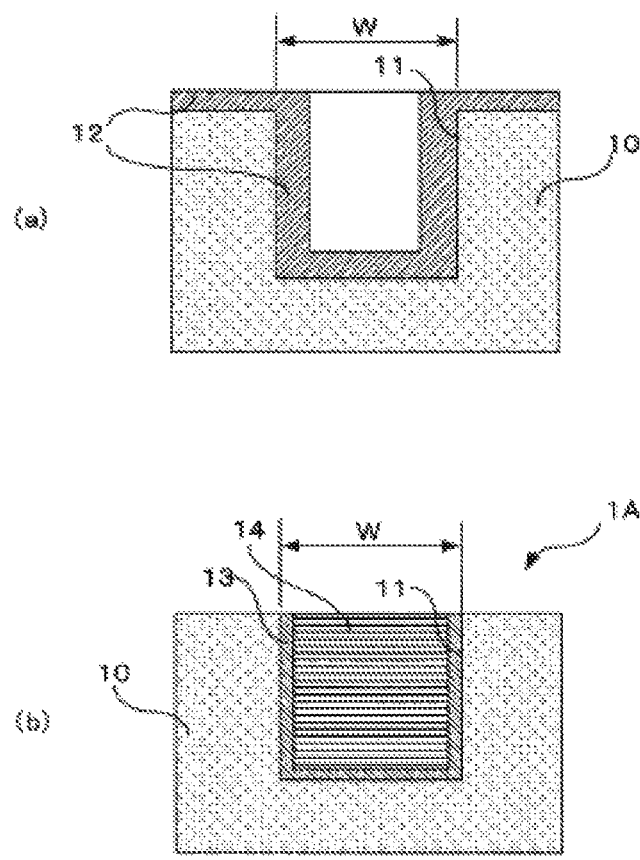
FIG. 1 illustrates a cross-sectional view of an embodiment of a copper interconnection structure and a schematic diagram of a process for manufacturing the structure.

Embodiments of the present invention will be described hereinafter with reference to the accompanying drawings, in which preferred exemplary embodiments of the invention are shown. The ensuing description is not intended to limit the scope, applicability or configuration of the disclosure. Rather, the ensuing description of the preferred exemplary embodiments will provide those skilled in the art with an enabling description for implementing preferred exemplary embodiments of the disclosure. It should be noted that this invention may be embodied in different forms without departing from the spirit and scope of the invention as set forth in the appended claims.

In a damascene type interconnection structure, a diffusion barrier layer of the present invention, which contains manganese oxide, is formed on an electric insulating layer. In one embodiment, the electric insulating layer is a layer made of silicon containing inorganic compound materials such as oxygen (O), nitrogen (N), carbon (C), or fluorine (F), for example. The electric insulating layer can be made from dense or porous silicon nitride (SiN), silicon oxide carbide (SiOC), silicon nitride oxide (SiNO), silicon fluoride oxide (SiFO), poly (allylene ether), silicon dioxide (SiO$_2$), polyimide and the like.

In another embodiment, the diffusion barrier layer of the present invention is provided on the electric insulating layer made of oxygen containing organic silicon compound, such as dense or porous hydrogen silsesquioxane (HSQ) or methyl silsesquioxane (MSQ) (refer to "Semiconductor Device ($2^{nd}$ edition)—Physics and Technology" by S. M. Sze P 346-347 above). For example, the diffusion barrier layer is provided on an insulating layer made of MSQ with a porosity of about 10% to 40% and a relative permittivity of 2.0 to 2.5 (refer to Physics Dictionary by Editorial Committee of Physics Dictionary, Sep. 30, 1985, Baihusha, first edition, P. 518).

Further, in other embodiments, the insulating layer may be structured from a numerically single SiO$_2$ layer or from a multilayer structure made from different materials such as a silicon nitride (Si$_3$N$_4$) layer stacked over a SiOC layer. Further, the electric insulating layer may be structured from a porous HSQ layer or MSQ layer having a plurality of pores with the average pore diameter of about 1 nm. Alternatively, in the electric insulating layer of the present invention damages resulted from the plasma treatment of the porous SiOC layer and the like are repaired using an organic silicon compound glass.

In yet another embodiment, the diffusion barrier layer of the present invention may be provided on a layer containing a metal element (described hereinafter as symbol "m") other than manganese, which constitutes the oxide contained in the diffusion barrier layer. The layer containing the metal element (m) is a layer made of the metal element (m), or a layer containing oxide, nitride, or carbide of the metal element. By way of example, the oxide of the metal element may include aluminum oxide, cobalt oxide, niobium oxide, tin oxide, magnesium oxide, tantalum oxide, titanium oxide, chromium oxide, vanadium oxide, ruthenium oxide, or hafnium oxide. Examples of the nitride of the metal element (m) may include tantalum nitride, titanium nitride, zirconium nitride, vanadium nitride, or tungsten nitride. The carbide of the metal element may be made of interstitial solid solution, such as titanium carbide, zirconium carbide, vanadium carbide, tantalum carbide, or tungsten carbide. However, the adhesiveness between the carbide of the metal element (m) and the metal oxide, such as manganese oxide (MnO) constituting the diffusion barrier layer pertaining to the present invention, is generally poor. Thus the carbide of the metal element (m) may not be favorably used.

The metal element (m) favorably used in the layer, on which the diffusion barrier layer is formed, is a metal element that can be oxidized easily compared to copper. Since the oxide formation enthalpy $\Delta H^{293}$ of copper is −167.5 kJ/mol, the favorable metal element (m) is a metal element with the oxide formation enthalpy lower than this value. If the metal element is more easily oxidized compared to copper, its chemical connectivity is stronger with oxygen than copper. Therefore, oxygen of the insulting layer, which is mainly made of silicon oxide, can surely be prevented from moving into the copper interconnection body, for example. In this way, the intrusion of oxygen atoms into the copper interconnection body may be prevented. Therefore, there is an advantage in that the interconnection body may be formed from high-purity copper with low electric resistance that contains low amount of incorporated impurities.

Example of metal elements with an enthalpy of oxide formation lower than copper may include magnesium ($\Delta H^{293}$=−601.6 KJ/mol), titanium ($\Delta H^{293}$=−2457.2 KJ/mol), vanadium (V) ($\Delta H^{293}$=−1551.3 KJ/mol), chromium (Cr) ($\Delta H^{293}$=−1130.4 KJ/mol), cobalt (Co) ($\Delta H^{293}$=−905.6 KJ/mol) nickel (Ni) ($\Delta H^{293}$=−240.7 KJ/mol), zirconium (Zr) ($\Delta H^{293}$=−1101.3 KJ/mol), niobium (Nb) ($\Delta H^{293}$=−1900.8 KJ/mol), molybdenum (Mo) ($\Delta H^{293}$=−746.1 KJ/mol), ruthenium (Ru) ($\Delta H^{293}$=−304.4 KJ/mol), rhodium (Rh) ($\Delta H^{293}$=−383.0 KJ/mol), hafnium (Hf) ($\Delta H^{293}$=−1113.7 KJ/mol), tantalum (Ta) ($\Delta H^{293}$=−2047.3 KJ/mol), or tungsten (W) ($\Delta H^{293}$=−838.6 KJ/mol).

Preferably, the diffusion barrier layer of the present invention is formed on the layer containing the metal element (m) which has an enthalpy of oxide formation lower than copper and also lower than silicon. The enthalpy of oxide formation for silicon ($\Delta H^{293}$) is −910.9 kJ/mol. Because the metal element (m) of the present invention is oxidized easily compared to silicon, it may easily form a bonding with oxygen atoms contained in the insulating layer. Therefore, the metal element (m) contributes in forming a diffusion barrier layer superior in bonding and adhesiveness with the insulating layer. Furthermore, similar to the case of the metal element more oxidizable compared to copper, the metal element (m) which is more oxidizable compared to silicon exerts the action of preventing oxygen atoms from intruding into the copper interconnection body from the insulating layer.

Among the metal elements (m) having an enthalpy of oxide formation lower than copper and even silicon, tantalum and titanium are the most favorable. This is mainly due to the fact that the metal layer, the metal oxide layer, or the metal nitride layer of tantalum or titanium are superior in terms of the adhesiveness with the diffusion barrier layer of the present invention. The layer, on which the diffusion barrier layer is formed, may be formed from a multilayer structure made of tantalum layer, tantalum nitride layer, or tantalum oxide layer. Alternatively, the layer may be formed from a multilayer structure made of titanium layer, titanium nitride layer, or titanium oxide layer. In the case where the diffusion barrier layer is formed on the multilayer structure made of tantalum and tantalum nitride layers, it is preferable that the tantalum nitride layer, which is superior in bonding and adhesiveness with the insulating layer, e.g. silicon oxide, is directly formed on the insulating layer side and the tantalum layer, which exerts the barrier properties against the diffusion of copper from the interconnection body into the insulating layer, is formed on the tantalum nitride layer, where the diffusion barrier layer and the copper interconnection body are formed.

The diffusion barrier layer pertaining to the present invention can be directly formed on the surface of the insulating layer, which is made of an amorphous glass, such as silicate glass or borosilicate glass, or quartz glass, when forming copper interconnections for use in an ohmic contact type source or drain electrode or a Schottky barrier junction type gate electrode of thin film transistors (TFTs) or metal oxide semiconductor (MOS) structure transistors for manufacturing semiconductor devices, such as LCDs.

Onto the insulating layer or the layer containing the metal element (m), the diffusion barrier layer which is composed of an oxide layer is formed. The diffusion barrier layer is formed from a copper alloy layer including a metal element, as an alloying material, with a diffusion coefficient greater than the self diffusion coefficient of copper at 400° C. (>$D_{400}$=5.51× $10^{-21}$ cm$^2$/s) and an energy of oxide formation smaller than the energy of oxide formation for copper at 293 K (<$\Delta H^{293}$=−167.5 kJ/mol). The metal elements which may be favorably used to structure the diffusion barrier layer made of the oxide of the metal element may include manganese ($D_{400}$=1.97× $10^{-20}$ cm$^2$/s, $\Delta H^{293}$=−1387.5 kJ/mol), titanium ($D_{400}$=4.24× $10^{-20}$ cm$^2$/s), germanium (Ge) ($D_{400}$=1.13×$10^{-19}$ cm$^2$/s, $\Delta H^{293}$=−580.2 kJ/mol), tin ($D^{400}$=2.08×$10^{-19}$ cm$^2$/s, $\Delta H^{293}$=−580.7 kJ/mol), antimony (Sb) ($D_{400}$=5.51×10$^{-19}$ cm$^2$/s, $\Delta H^{293}$=−1008.0 kJ/mol), bismuth (Bi) ($D_{400}$=1.15× 10$^{-18}$ cm$^2$/s, $\Delta H^{293}$=−570.7 kJ/mol) and the like.

Among the above-mentioned metal elements, manganese is the most favorable material for forming the diffusion barrier layer, which is an oxide layer including manganese, in a self forming manner on the surface of the insulating layer made of silicon oxide or inorganic glass. As explained before, the diffusion barrier layer, which is a manganese oxide layer, is formed from a copper layer including manganese. For example, the copper layer may be formed from a copper-manganese (Cu—Mn) alloy layer. The copper alloy layer may contain substitutional or interstitial solid solution of copper. By way of example, the copper manganese solid solution may contain manganese atoms in a ratio of 3% to 10% (refer to Japan Patent No. 4065959). The copper manganese solid solution referred herein is a solid solution in which copper atoms are substituted by manganese atoms at the lattice sites of copper crystal, and a substitutional solid solution in which the substitution by manganese atoms occurs randomly at the Cu lattice sites. (refer to "CBA Chemistry" translated by Bunichi Tamamushi, Feb. 20, 1971, published by Iwanami Shoten Publishers, second printing, P. 284).

The oxide layer including manganese may also be formed using a multilayer structure in which a copper layer and a manganese layer are stacked as the barrier layer forming materials. In this embodiment, the order of deposition of layers is interchangeable, which means either of the copper layer or the manganese layer may be formed directly on an upper surface of the insulating layer. The manganese layer of the multilayer structure is preferably formed using high-purity manganese as the base material. Especially, it is preferable that the high-purity manganese does not contain more than 0.1% in atomic concentration of lithium (Li), beryllium (Be), calcium (Ca), boron (B), iron (Fe), palladium (Pd), platinum (Pt), gold (Au), or thorium (Th). In addition, it is preferable to form a copper layer using a high-purity copper of not less than 99.9999% (6N) as a material.

In another embodiment, the oxide layer including manganese may be formed using a multilayer structure which is made of a copper manganese alloy layer and a copper layer. For example, the oxide layer can be formed using a multilayer structure consisting of a copper alloy layer containing 10% of manganese in atomic concentration and a layer composed of high-purity copper as the base material. An advantage of this embodiment is that the diffusion barrier layer is especially low in atomic concentration of manganese atoms because the overall atomic concentration of manganese is relatively small.

In an alternative embodiment, the diffusion barrier layer which is the oxide layer containing manganese may be formed using the multilayer structure consisting of a copper manganese alloy layer, a manganese layer, and a copper layer. Various methods may be used for forming the different layers of the multilayer structure. Examples of those methods may include a high-frequency sputtering method including a reactive sputtering method, a chemical vapor deposition (CVD) method, such as a low-pressure method, an atomic layer epitaxy (ALE) method, an electrolytic plating method, an ion plating method, a laser ablation method, and the like. It should be noted that each of the layers constructing the multilayer structure may be formed by different methods. Although the multilayer structure in various embodiments of the present invention are made from different layers, there are no distinction between the copper manganese alloy layer, or the multilayer structure made from the manganese layer and the copper layer, or made from the copper layer and the copper manganese alloy layer which are used as copper layer materials for forming the diffusion barrier layer. Thus, these layers pertaining to various embodiments of the present invention are hereinafter collectively referred to as "copper layer" in the present disclosure.

The diffusion barrier layer is formed by heating the copper layer formed by the above-mentioned methods. Especially, in the present invention, the diffusion barrier layer is formed by heating the copper layer in an inert gas containing hydrogen ($H_2$), or carbon monoxide (CO), for example. Halogen gases, such as chlorine gas ($Cl_2$), can not be favorably used in the present invention because the gas roughly damages the diffusion barrier layer in some situation. Examples of inert gas atmospheres may include helium (He), neon (Ne), argon (Ar), krypton (Kr), xenon (Xe). Among these inert gas atmospheres, argon gas is the most preferable choice because argon has a large atomic radius and therefore it is difficult to intrude into the copper layer, which is used as the forming material of the diffusion barrier layer.

By heating the copper layer, the diffusion barrier layer which is made from a manganese oxide layer ($Mn_xO_y$, y/x<2), either entirely or at least its surface portion, is formed. The temperature for heating the copper layer preferably ranges from 200° C. to 600° C. More preferably, the temperature for heating the copper layer ranges from 350° C. to 500° C. Further, when the heat treatment temperature is set to a higher level within the favorable range, as described above, it is advantageous to form the manganese oxide layer with a smaller compositional ratio of oxygen to manganese (y/x). In addition, when the heating period is set for a longer time, it becomes valid to form the manganese oxide layer with smaller compositional ratio of oxygen to manganese (y/x).

In the case where a copper manganese alloy layer, formed on an insulating layer made of silicon-containing oxide, is heated in a vacuum or an inert gas containing reducible gas, a manganese oxide layer which contains the composing elements of the insulating layer may be formed. For example, when heating the copper manganese alloy layer deposited on a porous SiOC layer, the oxide layer $MnSiO_3$ or $MnSi_2O_5$ which contains silicon may be formed. The composition of oxide layer containing the element (N) which is a composing element of the insulating layer is described as $Mn_xN_zO_y$ (z≥0, y/x<2). However, there may be a case where the oxide containing the composing element (N) is not formed depending on the heating condition. Therefore, in the present disclosure $Mn_xN_zO_y$ (z≥0, y/x<2) is also described collectively as $Mn_xO_y$.

In one embodiment, the copper layer, deposited on the insulating layer made of silicon oxide (SiOC), is heat treated in a vacuum environment in which the pressure is in the range of 5×10$^{-2}$ Pa to 0.1 Pa. In this embodiment, the diffusion barrier layer containing manganese oxide ($Mn_2O_3$) may be formed with the compositional ratio of oxygen to manganese (y/x=1.5). Meanwhile, by applying the heat treatment at temperatures ranging from 350° C. to 450° C. and for a heating period ranging from 5 minutes to 80 minutes, the diffusion barrier layer, which is mainly composed of $Mn_2O_3$ (y/x=1.5), may be stably formed.

In another embodiment, the copper layer, deposited on the insulating layer made of silicon oxide (SiOC), is heat treated in a vacuum environment in which the pressure is in the range of 5×10$^{-3}$ Pa to 5×10$^{-2}$ Pa. In this embodiment, the diffusion barrier layer containing manganese oxide ($Mn_3O_4$) may be formed with the low compositional ratio of oxygen to manganese (y/x=1.3). Meanwhile, by applying the heat treatment at temperatures ranging from 450° C. to 500° C. and for a heating period ranging from 5 minutes to 80 minutes, the diffusion barrier layer, which is mainly composed of $Mn_3O_4$ (y/x=1.3), may be stably formed.

In yet another embodiment, the copper layer, deposited on the insulating layer made of silicon oxide (SiOC), is heat treated in a high vacuum environment where the pressure is not exceeding $5\times10^{-3}$ Pa. In this embodiment, the diffusion barrier layer containing manganese oxide (MnO) with the low compositional ratio of oxygen to manganese (y/x=1) may be formed. Meanwhile, by applying the heat treatment at temperatures ranging from 500° C. to 550° C. and for a heating period ranging from 5 minutes to 80 minutes, the diffusion barrier layer, which is mainly composed of MnO (y/x=1.0), may be stably formed.

In other embodiments, the heat treatment of the copper layer, e.g. copper-manganese alloy layer, may be performed in an inert gas containing hydrogen as a reducible gas, instead of the vacuum environment as described above. In these embodiments, the diffusion barrier layer containing manganese oxide and having a composition formula similar to those when the heat treatment is performed in the vacuum environment. In a case where the copper layer is heated by using an argon atmosphere containing hydrogen as a reducible gas, it becomes more advantageous to form $Mn_xO_y$ (y/x<2) with low ratio of y/x. The heating period is preferably not less than 5 minutes and not more than 80 minutes.

When the copper layer is heat treated in an argon atmosphere containing hydrogen with a volume percentage ranging from 2 vol.ppm to 4 vol.ppm, the diffusion barrier layer containing manganese oxide ($Mn_2O_3$) with the compositional ratio of oxygen to manganese (y/x=1.5) can be formed. The heating temperature is preferably in the range of about 350° C. to 420° C. The heating period is preferably not less than 5 minutes and not more than 80 minutes.

Furthermore, when the copper layer is heat treated in an argon atmosphere containing hydrogen with the volume percentage ranging from 5 vol.ppm to 15 vol.ppm, the diffusion barrier layer containing manganese oxide may be formed with the following composition formula: $Mn_3O_4$ (y/x=1.3). In this embodiment, the heating temperature is preferably in the range of about 450° C. to 480° C. The heating period is preferably not less than 5 minutes and not more than 80 minutes.

Moreover, when the copper layer is heat treated in an argon atmosphere containing hydrogen with the volume percentage ranging from 18 vol.ppm to 30 vol.ppm, the diffusion barrier layer containing manganese oxide may be formed with the following composition formula: MnO (y/x=1). In this embodiment, the heating temperature is preferably in the range of about 500° C. to 550° C. The heating period is preferably not less than 5 minutes and not more than 80 minutes.

In the above-mentioned embodiments, argon gas containing hydrogen is used as an inert gas containing reducible gas. In a case where helium is used as the inert gas, the diffusion barrier layer containing the manganese oxide with the same composition formula $Mn_xO_y$ (y/x<2) may be formed as long as the mixed quantity of hydrogen gas and the heating conditions are the same as those described in the case of argon gas.

Regardless of heating the copper layer in vacuum or in an inert gas containing reducible gas atmosphere, the possibility of forming the manganese oxide layer with a lower compositional ratio of oxygen to manganese (y/x ratio), such as $Mn_2O_3$ (y/x=1.5), $Mn_3O_4$ (y/x=1.3) or MnO (y/x=1), will increase when the heat treatment is performed for a longer period of time, e.g. exceeding 80 minutes, at temperatures which are suitable for forming the diffusion barrier layer composed of each of the above-mentioned manganese oxides. However, if the heat treatment is performed for a longer period of time, specifically exceeding 100 minutes, the surface of the barrier layer will become rough. Therefore, inconveniences arise in that the diffusion barrier layer with a flat surface, which provides stably a copper interconnection body superior in adhesiveness, may not be formed.

For example, in the case where a diffusion barrier layer composed of manganese oxide with the following composition formula: $Mn_2O_3$ (y/x=1.5) is intended, the possibility of forming the diffusion barrier layer with a lower compositional ratio (y/x), such as $Mn_3O_4$ (y/x=1.3) is increased if the heat treatment is performed at temperatures ranging from 350° C. to 420° C. for a time period exceeding 80 minutes. Further, when the heat treatment is performed at temperatures ranging from 450° C. to 480° C. for a time period exceeding 80 minutes, the possibility of forming the diffusion barrier layer with the lower compositional ratio y/x, such as MnO (y/x=1) is increased.

In the case where the diffusion barrier layer is formed by conducting the heat treatment in a vacuum or an inert gas atmosphere containing hydrogen, the vacuum of the atmosphere or hydrogen content of the atmosphere is not necessarily constant in time. In other words, to form the diffusion barrier layer composed of the manganese oxide it is not necessary that the compositional ratio of oxygen to manganese (x/y) is identical everywhere. For example, If the vacuum of atmosphere is increased, which means the pressure is decreased, progressively, moderately or in the steps towards the end of the heat treatment process, the barrier layer which contains relatively larger amount of manganese oxide with a lower compositional ratio of oxygen to manganese (y/x) may be formed towards the surface of the barrier layer. Further, for example, if the hydrogen gas is added to the atmosphere towards the end of the heat treatment process when the surface portion of the diffusion barrier layer is formed, the diffusion barrier layer in which the surface portion is made from manganese oxide with the compositional ratio of oxygen to manganese (y/x) less than 2 may be formed.

Thereby, the manganese oxide with nonstoichiometric composition may exist as an additional phase in which the compositional ratio is smaller by δ than the compositional ratio (y/x) of the underlying phase formed in the early stage of annealing. However, there is no difference in that the copper interconnection body superior in bonding adhesiveness may be formed on the surface portion of the barrier layer as long as the entire diffusion barrier layer or at least the surface portion of it is formed from the manganese oxide with nonstoichiometric composition which satisfies the condition of y/x<2 for the compositional ratio of the oxygen to manganese.

For example, the barrier layer superior in bonding for adhesiveness with the copper interconnection body does not lose its bonding with the copper interconnection even when the diffusion barrier layer is formed from a mixture of $Mn_2O_3$ (y/x=1.5) and $Mn_3O_4$ (y/x=1.3). Further, even when the diffusion barrier layer is formed from a mixture of $Mn_2O_3$ (y/x=1.5), $Mn_3O_4$ (y/x=1.3), and MnO (y/x=1.0), the adhesiveness with the copper interconnection body will not be lost.

The diffusion barrier layer made of $Mn_xO_y$ (y/x<2) can efficiently be formed on the layer containing the metal element (m) other than manganese with the enthalpy of oxide formation lower than copper. For example, the manganese series oxide, such as $Mn_xO_y$ or $Mn_xSi_zO_y$ with the compositional ratio of oxygen to manganese (y/x) less than 2, may easily be formed on a multilayer structure made of tantalum. In the multilayer structure containing tantalum, a tantalum nitride (TaN) layer and a tantalum (Ta) layer are provided in order on an insulating layer containing silicon and oxide.

Tantalum is easily oxidized compared to silicon (Si) (enthalpy of oxide formation for tantalum Δ293=−2047.3 kJ/mol is lower than that of Silicon Δ293=−910.9 kJ/mol). Therefore, oxygen which diffuses into the diffusion barrier layer containing manganese, from the insulating layer containing silicon and oxide, can easily be captured by tantalum and the like which is the composing metal element (m) of the multilayer structure. As it turns out, the amount of oxygen intruding into the diffusion barrier layer decreases. Thereby, the manganese oxide layer with the compositional ratio of oxygen to manganese less than 2 (y/x<2) may be easily formed. Similar to the tantalum series layer described above, the diffusion barrier layer composed of $Mn_xO_y$ (y/x<2) can also be formed on a titanium (Ti) series layer (ΔH293=−2457.2 kJ/mol), which is also easily oxidized compared to silicon. For example, onto the multilayer structure of titanium and titanium nitride (TiN), the diffusion barrier layer containing $Mn_xO_y$ with the compositional ratio of oxygen to manganese less than 2 (y/x<2) may be easily formed.

In order to form the diffusion barrier layer corresponding to the interconnection width of 45 nm, 32 nm or less, it is necessary to reduce the width of the interconnection in accordance with the reduction in the thickness of the diffusion barrier layer. For example, in the case where the interconnection width is about 45 nm, it is required that the thickness of the diffusion barrier layer be preferably equal to or less than 5 nm. Although, the layer made of titanium series material, such as titanium or titanium nitride, has a good ability in forming the manganese oxide layer, $Mn_xO_y$ (y/x<2), often the manganese oxide layer becomes discontinuous because it is formed into a thin layer, and thereby, a gap is created in the discontinuous section. For example, in the gap section of the ultra thin film of titanium series material, the surface of the interlayer insulating layer is exposed. Therefore, disadvantages are caused, such as the decrease of the electric insulating property of the interlayer insulating layer, because the interlayer insulating layer and the copper interconnection body are in direct contact.

In order to resolve the above-mentioned disadvantage, a multilayer structure is proposed in which the diffusion barrier layer containing $M_xO_y$ (y/x<2) is formed by depositing a copper layer containing manganese on an ultra thin layer made of tantalum series material, for example. Using this structure, manganese with a high diffusion coefficient moves towards the insulating layer seeking to bond with oxygen atoms of the interlayer insulating body. The oxygen atoms are exposed in the gap section of the tantalum series ultra thin film. Thereby the layer containing manganese oxide can be formed so as to fill up the gap. This manganese oxide layer works to supplement the barrier property of the tantalum series or titanium series ultra thin layer. Therefore, such a multilayer structure is advantageous in that a copper interconnection body with a higher EM resistance and a lower operating leak current may be provided.

The diffusion barrier layer containing manganese oxide ($Mn_xO_y$) with the low compositional ratio of oxygen to manganese (y/x<2) exerts a significant effect to provide a copper interconnection body, which is superior in adhesiveness. In order to form stably and consistently the copper interconnection body superior in bonding strength and adhesiveness, the surface portion of the diffusion barrier layer has to be made from the manganese oxide ($Mn_xO_y$) with a compositional ratio of oxygen to manganese less than 2 (y/x<2). The composition of $Mn_xO_y$ layer (x,y) can be examined by an electron energy-loss spectroscopy (EELS) method, an X-ray photo-electron spectroscopy (XPS(ESCA)) method, an X-ray energy dispersive spectroscopy (EDS) method, an Auger electron spectroscopy (AES) and the like.

After forming the diffusion barrier layer, copper which constitutes the interconnection body is deposited on the oxide layer composed of $Mn_xO_y$ (y/x<2). In an interconnection with a single or dual damascene structure, copper is provided so as to fill up the space inside of the interconnection groove. Copper constituting the interconnection body may be formed by an electrolytic plating method, for example. Further, the method used for forming the copper interconnection body is not necessarily the same as the one used for forming the manganese oxide layer $Mn_xO_y$ (y/x<2) made of copper layer material. Since the diffusion barrier layer of the present invention, or at least its surface portion is made from $Mn_xO_y$ with the compositional ratio of oxygen to manganese less than 2 (y/x<2), it is possible to deposit copper, which is superior in adhesiveness, onto the diffusion barrier layer. The bonding strength of the diffusion barrier layer and copper can be measured by a peel test method, such as JIS cross-cut tape test (ASTM3359-87).

When the heat treatment is performed in an atmosphere containing a slight amount of oxygen after burying copper over the diffusion barrier layer in the interconnection groove such as trench groove or via hole, it is possible to form a manganese oxide layer on the opening surface of the copper interconnection body. The manganese oxide layer formed on the upper surface of the copper interconnection body has the following composition formula that satisfies the following conditions for the compositional ratio of oxygen to manganese:

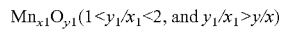
$$Mn_{x1}O_{y1} (1 < y_1/x_1 < 2, \text{ and } y_1/x_1 > y/x)$$

In this embodiment, the compositional ratio of the manganese oxide layer on the top surface of the interconnection body ($y_1/x_1$) is greater than the compositional ratio of the manganese oxide layer or the diffusion barrier layer (y/x). The opening surface of the copper interconnection body is not facing the electric insulating layer and is the surface directly exposed to the heat treatment atmosphere containing oxygen. For example, in this embodiment, the opening surface is a top surface of the copper interconnection body, which is buried in the trench groove.

The diffusion barrier layer of the present invention is formed on a region with an interface with the insulating layer which has the compositional ratio of oxygen to manganese less than 2. In other words, the diffusion barrier layer of the present invention contains manganese more abundantly compared to the composition of manganese oxide (IV) ($MnO_2$). The excessive amount of manganese, from the oxide layer $Mn_xO_y$ (y/x<2), diffuses and moves towards the opening surface of the interconnection body, by a generated electric filed which occurs by oxygen atoms contained in the heat treatment atmosphere that are absorbed on the opening surface of the copper interconnection body. Thereafter, the excessive amount of manganese, moved to the opening surface of the copper interconnection body, is bond to oxygen atoms which are sufficiently supplied from the heat treatment atmosphere. Thereby, the excessive amount of manganese contributes in forming the manganese oxide layer ($Mn_{x1}O_{y1}$, $1<y_1/x_1<2$ and $y_1/x_1>y/x$) at the top surface of the copper interconnection body.

The oxide layer formed on the upper surface of the copper interconnection body is an oxide layer in which the oxidation of manganese atoms are further progressed and therefore this oxidation prohibits the oxide layer from forming stably by the heat treatment in an inert gas containing reducible gas. That is, the manganese oxide layer formed onto the opening surface of the copper interconnection body contains stoichiometrically abundant oxygen, which is higher than that contained in the manganese oxide layer ($Mn_xO_y$ ($y/x<2$)) of the diffusion barrier layer. This second oxide layer, formed on the opening surface of the copper interconnection body, is useful for preventing oxidization of the copper interconnection body and is also capable of contributing in providing the copper interconnection body with a low electrical resistance.

Further, this second oxide layer is formed by attracting manganese atoms into the opening surface of the copper interconnection body. The manganese was excessive at the time when the diffusion barrier layer containing the oxide layer was forming. Therefore, the copper interconnection body which is low in the leakage of the operation current may be formed.

In order to form the manganese oxide layer on the opening surface of the copper interconnection body, after depositing the copper interconnection body, a suggested method is to anneal the upper surface of the interconnection body in an inert gas containing oxygen at a ratio ranging from 0.5 vol.ppm to 10 vol.ppm, for a time period ranging from 5 minutes to 80 minute, and at temperatures ranging from 250° C. to 550° C. In this way, the manganese oxide layer $Mn_{x1}O_{y1}$, ($1<y_1/x_1<2$ and $y_1/x_1>y/x$) has the compositional ratio of oxygen to manganese ($y_1/x_1$) greater than that of the diffusion barrier layer ($y/x$). Since high temperatures are used for heating the upper surface of the copper interconnection body, the thickness of the resulting manganese oxide layer will increase in proportion with the logarithm value of the heating period. Further, the higher the oxygen concentration, the resulting manganese oxide layer will be formed in a shorter period of time. In a case where the heat treatment temperature or the oxygen concentration is different, the trend of increasing the thickness of the manganese oxide layer in proportion to the logarithm value of the heating time (time of supplying the inert gas containing oxygen) is confirmed.

Further, the manganese oxide layer, formed on the opening surface of the copper interconnection body, may also be formed by applying the heat treatment at temperatures ranging from 250° C. to 550° C., in an inert gas with the oxygen concentration of less than 0.5 vol.ppm. However, in this embodiment, the resulting oxide layer is generally thinner than 1 nm and therefore the manganese oxide layer with a sufficient thickness, generally about 2 nm or more, may not be formed to prevent the oxidation of the copper interconnection body. In addition, the resulting manganese oxide layer on top of the copper interconnection body $Mn_{x1}O_{y1}$, in such an atmosphere with low oxygen concentration, is a layer with significantly lower compositional ratio of oxygen to manganese ($y_1/x_1 \ll 1$). Therefore, the manganese oxide layer with superior electrical resistance may not be formed.

On the other hand, it is not preferable to perform the heat treatment at temperatures ranging from 250° C. to 550° C., in an inert gas with oxygen concentration exceeding 10 vol.ppm. Because such a heat treatment promotes the oxidation of manganese in a higher rates and therefore results in forming the following manganese dioxide layer: $MnO_2$. According to stock nomenclature, the manganese dioxide is manganese oxide (IV). Although the manganese oxide layer, which is superior in electric insulating properties, may be formed from the manganese oxide (IV) ($MnO_2$), there is a disadvantage in that the adhesiveness between the $MnO_2$ and the copper interconnection body is lower compared to the case of the manganese oxide layer ($Mn_{x1}O_{y1}$) with the following compositional ratio: $1<y_1/x_1<2$.

The manganese oxide layer may be stably formed, especially by applying a heat treatment to the upper surface of the copper interconnection body, in an inert gas, which contains oxygen at a ratio not less than 0.5 vol.ppm and not more than 5 vol.ppm, for a heating period ranging from 5 minutes to 60 minutes, and at temperatures ranging from 250° C. to 450° C. The upper surface of the copper interconnection body is not facing the insulating layer. The manganese oxide layer contains metal series element, which are composed of the elements of the insulating layer. A total amount of metal series element in the second oxide layer is smaller than the total amount of metal element in the diffusion barrier layer.

Examples of the metal series element constituting the insulating layer may include silicon (Si), which is a half metal, (Ru), or hafnium (Hf) which are the metal elements containing in the insulating layer composed of silicon containing oxide, such as SiOC, SiOF, SiON, ruthenium oxide (RuO), or hafnium oxide (HfO), for example. Here, non metal elements, such as oxygen (O), nitrogen (N), or fluorine (F) are not included. The concentration of metal series elements in the saturated oxide ($MnO_2$) layer of the diffusion barrier layer ($Mn_xO_y$, $y/x<2$) may be quantified by various analysis methods, such as EELS, SIMS, AES or the like.

The manganese oxide layer containing low metal series element, such as electric conductive metal elements or half metal elements, has high electrical insulating properties. Therefore, the copper interconnection body with a low leakage in operating current may be formed using the manganese oxide layer with high insulating properties, formed on the upper surface of the interconnection body. Consequently, this manganese oxide layer may contribute in providing semiconductor devices with low power consumption and high operating reliability.

Embodiments

Embodiment 1

In the following paragraphs, the contents of the first embodiment pertaining to the present invention will be fully explained using an example in which a damascene type copper interconnection structure is provided with a diffusion barrier layer, containing manganese oxide, which is in turn formed from a copper manganese layer as the forming barrier layer material.

FIG. 1 illustrates a cross-sectional view of an embodiment of a copper interconnection structure and a schematic diagram of a process for manufacturing the structure. With reference to FIG. 1(a), a schematic diagram of the first half of a process for manufacturing an embodiment of the copper interconnection structure 1A is shown. As shown in this figure, a trench form interconnection groove 11 is formed in an interlayer insulating layer 10, e.g. SiOC, with a thickness of 200 nm. The vertical width (opening width) of the interconnection groove 11, W, is set to be about 32 nm. Then, a copper manganese (Cu—Mn) alloy layer 12 is deposited onto the surface of the insulating layer 10, including an inner and upper surface side of the interconnection groove 11 (FIG. 1a). The manganese (Mn) is a metal element with an enthalpy of oxide formation lower than copper. The copper manganese alloy layer 12 is formed by a common high-frequency sputtering method using a copper manganese alloy made of high-purity (99.9999%) copper (Cu) and high-purity (5N) manganese as a target material. The manganese content of the copper manganese alloy target is about 7% in atomic concentration. The atomic concentration of manganese in the deposited copper manganese alloy layer 12 is quantified as 4% by an electron energy-loss spectroscopy (EELS) method. The thickness of the copper manganese alloy layer 12 is set to be about 4 nm.

Referring next to FIG. 1(b), a schematic diagram of the second half of the process for manufacturing an embodiment of the copper interconnection structure 1A is shown. In the next step, the copper manganese alloy layer 12 is heated for about 20 minutes at a temperature of about 350° C. in an argon atmosphere containing hydrogen with a volume percentage of about 5 vol.ppm. During the heat treatment, the volume concentration of hydrogen is retained constant (5 vol.ppm) from beginning to the end. By this heat treatment, the manganese atoms is diffused from the copper manganese alloy layer 12 and moved toward a region where the SiOC insulating layer 10 is joined with the copper alloy layer. Thereby, as schematically shown in FIG. 1b, a diffusion barrier layer 13 containing manganese oxide is formed by bonding with oxygen atoms constituting the SiOC insulating layer 10. Due to the phase disassociation, resulted from the heating process, the surface of the diffusion barrier layer 13 is made from a layer mainly composed of copper.

The composition of the manganese oxide in the diffusion barrier layer 13 is analyzed using an X-ray energy dispersive spectroscopy (EDS) device attached to a field emission scanning electron microscopy (Phillips FE-TEM CM200 type). Based on the EDS analysis, it is shown that the manganese oxide constituting the diffusion barrier layer 13 is mainly composed of $Mn_2O_3$ with the compositional ratio of oxygen to manganese (y/x) equal to 1.5. Further, according to the EDS analysis, it is also confirmed that the diffusion barrier layer 13 includes copper in a small amount. The atomic concentration of copper in the diffusion barrier layer 13 is about ½ of the atomic concentration of manganese which is maximized in the diffusion barrier layer 13.

Next, onto the surface of the diffusion barrier layer 13 composed of manganese oxide (III), $Mn_2O_3$, a buried copper representing the copper interconnection body 14 is deposited so as to fill the inside of the interconnection grove 11. The copper interconnection 14 is formed using an electrolytic plating method. Thereafter, copper which is excessively formed on the interconnection groove 11 and the diffusion barrier layer 13 remained on the interlayer insulating layer 10 are removed by a chemical and mechanical polishing (CMP) method. This polishing is performed until the surface of the insulating layer 10 is exposed. In this way, a single damascene type copper interconnection structure 1A is formed, as shown in FIG. 1b. The adhesiveness or bonding strength between the diffusion barrier layer 13 and the copper interconnection body 14 is evaluated separately using an experimental sample. The experimental sample has similar structure as the one described above with regard to the first embodiment. This means a SiOC insulating layer with the thickness of about 200 nm, a manganese oxide layer ($Mn_2O_3$) and the buried copper with the thickness of about 200 nm are provided in series on a {001}-Si substrate. As a result, the adhesiveness between the diffusion barrier layer 13 ($Mn_2O_3$) and the copper interconnection body 14 is evaluated to be a favorable value of about 8 kg/cm$^2$.

Further, the electric resistivity (ρ) of the copper interconnection body 14 is measured by a direct current four-probe method at room temperature. The electric resistivity (ρ) is calculated using the following formula:

$$\rho = (\pi/\ln 2) \cdot t \cdot (V/I) \cdot f1 \cdot f2 \quad (1)$$

where t, I, and V represent respectively a thickness of the copper interconnection body 14, a current (50 mA) conducted into the copper interconnection body 14 from two probes facing each other at the time of measurement, and a voltage generated when the current I is conducted between other two probes. In this formula, f1 and f2 represent form factors pertaining to the copper interconnection body 14 (refer to F. M. Smith, The Bell System Technical Journal, 37(1958), P. 711). The electric resistivity of the copper interconnection body 14 is calculated for the first embodiment and it turns out to be about 2.2μΩ·cm, which is close to the resistivity of the pure bulk copper, 1.66μΩ·cm, (refer to the left column of upper row, on page 2 of Japanese unexamined patent publication No. H1-202841).

Embodiment 2

Figure 2:
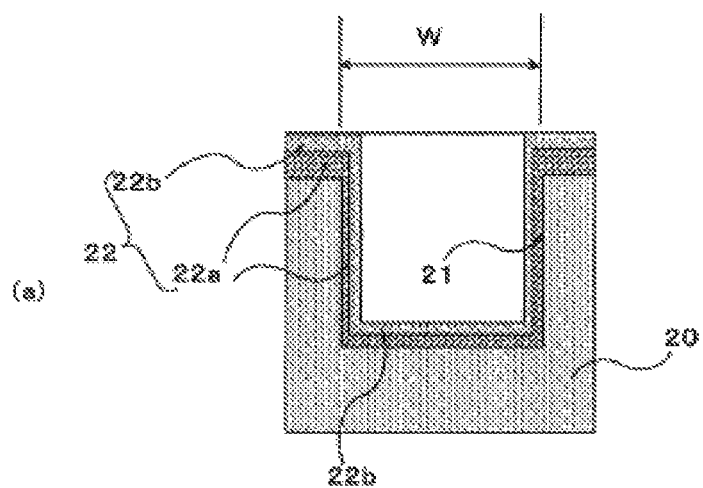
FIG. 2 illustrates a cross-sectional view of an alternative embodiment of a copper interconnection structure and a schematic diagram of a process for manufacturing the structure.
Figure 2:
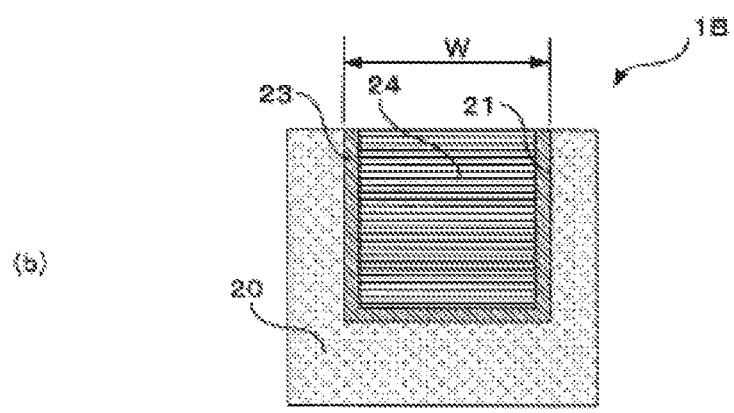

The second embodiment of the present invention is explained with reference to FIG. 2 using an example in which the copper interconnection structure is provided with a diffusion barrier layer, containing manganese oxide, which is in turn formed from a copper layer having a multilayer structure as the barrier layer forming material. The multilayer structure is made from stacked layers of manganese (Mn) and copper (Cu).

With reference to FIG. 2a, a schematic diagram of the first half of a process for manufacturing an embodiment of the copper interconnection structure 1B is shown. As shown in this figure, a trench form interconnection groove 21 is first formed in an insulating layer 20, e.g. SiOC, with a thickness of about 200 nm. The horizontal width (opening width) of the interconnection groove 21, W, is set to about 32 nm, same as the first embodiment as described above. Then, a manganese layer 22a is deposited over an inner surface and an upper surface side of the interconnection groove 21. The thickness of the manganese layer 22a is about 2 nm and its enthalpy of oxide formation is lower than that of copper. Next, a copper layer 22b with a thickness of about 2 nm is stacked, in series, over the manganese layer 22a, forming a multilayer structure 22. The manganese layer 22a and the copper layer 22b are both formed by the common high-frequency sputtering method using respectively a high purity manganese (degree of purity=5N) and high purity oxygen-free copper (degree of purity=6N) as the target materials. A cross-sectional view of the multilayer structure 22 formed on the insulating layer 20 is also shown on FIG. 2(a).

Referring next to FIG. 2(b), a schematic diagram of the second half of the process for manufacturing an embodiment of the copper interconnection structure 1B is shown. As the next step, the multilayer structure 22 is heated at a temperature of about 450° C. for 35 minutes in a vacuum environment with a pressure of $3 \times 10^{-2}$ Pa. In this way, the diffusion barrier layer 23, which is composed of manganese oxide, is formed at the interface between the SiOC insulating layer 20 and the multilayer structure 22, as shown in FIG. 2(b). This manganese oxide layer is formed by bonding the manganese atoms, which are diffused from the multilayer structure 22 toward the insulating layer 20, with the oxygen atoms composing the insulating layer 20. Further, the chemical bond energy of manganese inside of the diffusion barrier layer 23 is analyzed using the Electron Energy Loss Spectroscopy (EELS) method. The EELS analysis shows that the diffusion barrier layer 23 is mainly formed from the manganese oxide layer $Mn_3O_4$ with the compositional ratio of oxygen to manganese y/x=1.3. Based on this analysis, it is also shown that the surface portion of the diffusion barrier layer 23 (opposite to the one contacting directly the insulating layer 20) becomes a layer mainly composed of copper.

Next, the interconnection body 24 is formed by burying a high-purity copper over the diffusion barrier layer 23 using the layer mainly composed of copper as a copper seed layer. The buried copper representing the copper interconnection 24 is formed using an electrolytic plating method so as to fill the inside of the interconnection groove 21 (FIG. 2*b*). In the last step of manufacturing process, copper which is excessively formed on the interconnection groove 21 and the diffusion barrier layer 23 remained on the insulating layer 20 are removed by the chemical and mechanical polishing (CMP) method until the surface of the insulating layer 20 is exposed. In this way, a single damascene type copper interconnection structure 1B is completed as schematically shown in FIG. 2*b*. The adhesiveness or bonding strength between the diffusion barrier layer 23 and the copper interconnection body 24 is evaluated separately using an experimental sample. The experimental sample has similar structure as the one described above with regard to the second embodiment, in which a SiOC layer with the thickness of about 200 nm, a manganese oxide layer ($Mn_3O_4$) and the buried copper with the thickness of about 200 nm are provided in series on a {001}-Si substrate. As a result, the adhesiveness between the diffusion barrier layer 23, $Mn_2O_3$, and the copper interconnection body 24 is evaluated to be a favorable value of about 7 $kg/cm^2$.

Similar to the case of the first embodiment, the electric resistivity of the copper interconnection body 24 is measured by the direct current four-probe method. The result of this measurement shows a small value 2.2 $\mu\Omega \cdot cm$ at room temperature, as in the case of the first embodiment, which is close to the resistivity of pure bulk copper (1.7 $\mu\Omega \cdot cm$).

Embodiment 3

The third embodiment of the present invention is explained in detail using an example in which the copper interconnection structure is provided with a diffusion barrier layer, containing manganese oxide, which is in turn formed from a copper layer having a multilayer structure. The multilayer structure is made from the stacked layers of copper manganese (Cu—Mn) and copper (Cu) in series.

In this embodiment, similar to the previous cases, a trench form interconnection groove 21 is formed in an insulating layer 20, e.g. SiOC, with a thickness of about 200 nm. The horizontal width (opening width) of the interconnection groove, W, is set to be about 32 nm, which is the same as those described in the first and second embodiments. Onto the surface of the insulating layer 20, including the inner surface of the interconnection groove 21, a multilayer structure is formed by stacking in series a copper manganese alloy layer (Cu—Mn) and a copper (Cu) thin layer both with a thickness of about 2 nm. The manganese contained in the copper manganese (Cu—Mn) alloy layer has an enthalpy of oxide formation lower than that of copper. The copper manganese alloy layer and the copper thin layer are both formed by the common high-frequency sputtering method using respectively a copper manganese alloy containing 8% of manganese in atomic concentration and a high purity oxygen-free copper as the target materials. The atomic concentration of manganese in the deposited copper manganese alloy layer is quantified as 4% by the EELS method.

In the next step, the multilayer structure 22 is heated at a temperature of about 450° C. for 35 minutes in a vacuum environment with a pressure of $3 \times 10^{-2}$ Pa. In this way, the diffusion barrier layer 23 is formed at the interface between the SiOC insulating layer 20 and the multilayer structure 22. In this embodiment, the diffusion barrier layer 23 is composed of manganese oxide $Mn_3O_4$ with a compositional ratio of oxygen to manganese (y/x) equal to 1.3, which is lower compared to the first embodiment. This manganese oxide layer is formed by bonding the manganese atoms, which are diffused from the multilayer structure 22 toward the insulating layer 20, with the oxygen atoms composing the insulating layer 20. The composition of manganese oxide inside of the diffusion barrier layer 23 is obtained by EDS analysis method using the Field Emission Scanning Electron Microscopy.

Next, the interconnection body 24 is formed by burying copper over the diffusion barrier layer 23 using the electrolytic plating method so as to fill the inside of the interconnection groove 21. Separately, a peel test is performed using an experimental sample in which a SiOC layer with the thickness of about 200 nm, a manganese oxide layer ($Mn_3O_4$) and the copper plating layer with the thickness of about 200 nm are provided in series on a {001}-silicon substrate. As a result, the adhesiveness between the diffusion barrier layer 23, containing manganese oxide ($Mn_3O_4$), and the copper interconnection body 24 is evaluated to be a favorable value of about 7 $kg/cm^2$.

Similar to the first and second embodiments, the electric resistivity of copper interconnection body 24 is measured by the direct current four-probe method. The electric resistivity of the copper interconnection body is about 2.2 $\mu\Omega \cdot cm$ at room temperature, which is close to the electric resistivity of pure bulk copper (1.7 $\mu\Omega \cdot cm$).

Embodiment 4

The fourth embodiment of the present invention is explained with reference to FIG. 3 using an example in which the copper interconnection structure is provided with a double diffusion barrier layer formed from tantalum series and copper-manganese alloy (Cu—Mn) materials.

Figure 3:
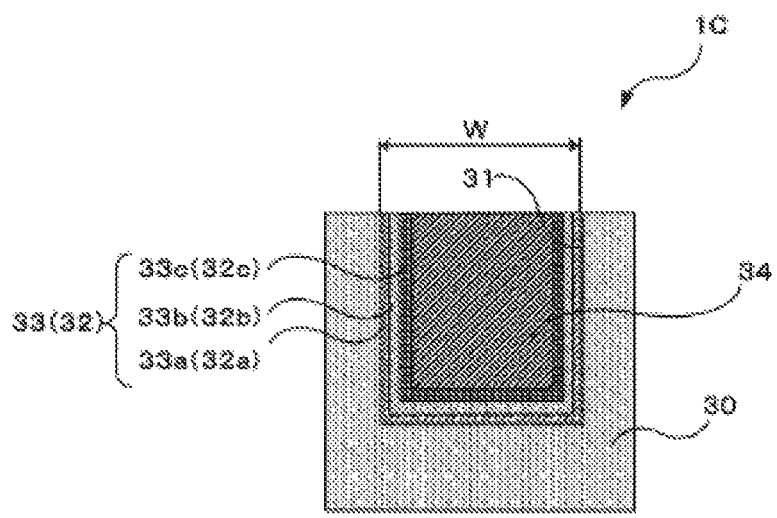
FIG. 3 illustrates a cross-sectional view of an alternative embodiment of a copper interconnection structure.

Referring next to FIG. 3, a cross-sectional view of an alternative embodiment of a copper interconnection structure 1C is shown. As shown in this figure, similar to the previous embodiments, a trench form interconnection groove 31 with an opening width of, W, 45 nm is formed in an interlayer insulating layer 30, e.g. SiOC, with a thickness of about 300 nm. Then, onto the surface of the interlayer insulating layer 30, including the inner surface of the interconnection groove 31, a tantalum nitride (TaN) thin layer 32*a* with a thickness of about 3 nm is first deposited by the common reactive ion sputtering method using the nitride gas ($N_2$) as a nitride source. Next, onto the TaN thin layer 32*a*, a tantalum thin layer 32*b* with a thickness of about 2 nm is deposited by the common high-frequency sputtering method.

Thereafter, onto the tantalum thin layer 32*b*, a copper manganese alloy layer 32*c*, with a thickness of about 2 nm, which contains 4% of manganese in atomic concentration, is deposited by the common high-frequency sputtering method. This copper manganese alloy layer 32*c* is made from an alloy of high-purity oxygen-free copper (6N) and high-purity manganese (5N) materials. In addition, the copper manganese alloy layer 32*c* is formed using an alloy target material in which total contents of impurities, such as lithium (Li), belilhium (Be), gallium (Ga), silicon (Si), chromium (Cr), cobalt (Co), niobium (Nb), platinum (Pt), samarium (Sm), or thorium (Th), is not more than 0.1% in atomic concentration (refer to Japanese Patent No. 4065019).

Next, the heat treatment process of the multilayer structure 32 is performed for forming the diffusion barrier layer 33. This heat treatment process is conducted at a temperature of about 520° C. in the vacuum environment with the pressure of $2 \times 10^{-3}$ Pa for about 10 minutes. The diffusion barrier layer 33 is formed from the tantalum nitride thin layer 33*a*, the tantalum thin layer 33*b*, and the manganese oxide layer 33*c*. It should be noted that the manganese oxide layer 33c is obtained by heat treating the copper manganese alloy layer 32c. Next, the damascene type copper interconnection structure 1C is completed by depositing copper on the surface of the diffusion barrier layer 33 using the electroplating method so as to fill the inside of the interconnection groove 31 (FIG. 3).

The manganese oxide layer 33c contains manganese oxide (II) with the following compositional formula: MnO having the compositional ratio of oxygen to manganese y/x equal to 1. This compositional ratio is lower compared to the case of the first and second embodiments. The manganese oxide layer 33c is formed at the interface of the tantalum thin layer 33b. The composition of manganese oxide inside of the diffusion barrier layer 33c is examined by an AES method. Further, the chemical binding energies of manganese and oxygen are analyzed using an X-ray photoelectron spectroscopy (XPS) method. This analysis shows that a slight amount of $Mn_3O_4$ is present in the manganese oxide layer 33c in addition to the manganese oxide II (MnO). The amount of present manganese oxide ($Mn_3O_4$) is estimated to be about $\frac{1}{10}$ of the amount of manganese oxide (II) at maximum. Meanwhile, the surface side of the manganese oxide layer 33c is formed mainly from copper due to the phase disassociation caused by the heating process.

A common cross-sectional TEM examination shows that the manganese oxide layer MnO is also formed in discontinuous sections, which occurred after the heat treatment process, due to the fact that the tantalum nitride thin layer 33a and the tantalum thin layer 33b do not have the sufficient thickness for forming a continuous layer. The manganese oxide layer MnO is formed so as to fill up the gaps in discontinuous sections. It is also shown that, in some situations, the manganese oxide layer MnO is formed so as to contact directly with the SiOC insulating layer 30, which is exposed in the gap created in discontinuous sections.

The adhesiveness or the bonding strength is also evaluated, in this embodiment, using an experimental sample having the same structure as the one described in the fourth embodiment. That is, the SiOC layer with the thickness of about 200 nm, the tantalum nitride layer with a thickness of about 3 nm, the tantalum layer with the thickness of about 2 nm, the manganese oxide layer MnO, and the copper plating layer with a thickness of about 200 nm are all provided in series on a {001}-silicon substrate. As a result of this measurement, the adhesiveness between the diffusion barrier layer 33, made of manganese oxide (II), MnO, and the copper interconnection body is evaluated and it turns out to be a favorable value of about 8 kg/cm$^2$.

Similar to the case of the previous embodiments (1-3), the electric resistivity of the copper interconnection body is measured by the direct current four-probe method. The electric resistivity of the copper interconnection body 34 is 2.2 μΩ·cm at room temperature, which is close to the resistivity of the resistivity of pure bulk copper (1.7 μΩ·cm).

Embodiment 5

The fifth embodiment of the present invention is explained using an example, in which the damascene type copper interconnection structure is provided with the double diffusion barrier layer formed from titanium series and copper-manganese alloy (Cu—Mn) materials.

Similar to the case of the fourth embodiment, a trench form interconnection groove 31 is formed in an interlayer insulating layer, e.g. SiOC, with a thickness of about 200 nm. The horizontal width (opening width) W of the interconnection groove 31 is set to be about 45 nm. Instead of tantalum series material of the fourth embodiment, a titanium nitride (TiN) thin layer with a thickness of about 3 nm is first deposited onto the surface of the interlayer insulating layer 30 by the common reactive ion sputtering method using the nitride gas ($N_2$) as the nitride source. Next, onto the TiN thin layer, a titanium thin layer with the thickness of about 2 nm is deposited using the common high-frequency sputtering method.

Thereafter, onto the titanium thin layer, a copper-manganese alloy layer with a thickness of about 2 nm, which contains 4% of manganese in atomic concentration, is deposited using the common high-frequency sputtering method. This copper-manganese alloy layer is formed using the copper-manganese alloy target. In the copper-manganese alloy target, the total contents of impurities, such as aluminum (Al), antimony (Sb), vanadium (V), yttrium (Y), molybdenum (Mo), palladium (Pd), gold (Au), rhenium (Re), or iridium (Ir) is set to not more than 0.1% in atomic concentration (refer to Japanese Patent No. 4065019). In this embodiment, the cross-sectional view of the copper interconnection structure, at the time of deposition, is similar to the case of the fourth embodiment as shown schematically in FIG. 3. The tantalum nitride thin layer 32a, shown in FIG. 3, is in fact the titanium nitride thin layer of the fifth embodiment. Accordingly, the tantalum thin layer 32b, shown in FIG. 3, corresponds to the titanium thin layer of the fifth embodiment.

Next, the multilayer structure of the fifth embodiment is heat treated for forming the diffusion barrier layer. Similar to the case of the fourth embodiment, the heat treatment is conducted at a temperature of about 520° C. in a vacuum environment with the pressure of $2 \times 10^{-3}$ Pa for 10 minutes. This diffusion barrier layer is formed from the titanium nitride thin layer, titanium thin layer, and the manganese oxide layer. It should be noted that the manganese oxide layer is obtained by heat treating the copper-manganese alloy layer of the multilayer structure. Next, the damascene type copper interconnection structure 1C is completed by depositing copper on the surface of the diffusion barrier layer using the electroplating method so as to fill the inside of the interconnection groove 31.

The chemical binding energy of manganese and oxygen is analyzed using the X-ray photoelectron spectroscopy (XPS) method. This analysis shows that the bonding region is formed at the interface of the titanium thin layer 33b. It also shows that the manganese oxide layer 33c is mainly composed of manganese oxide (II) with the following composition: MnO. Furthermore, the presence of a slight amount of $Mn_3O_4$ is also indicated in the bonding region.

Figure 4:
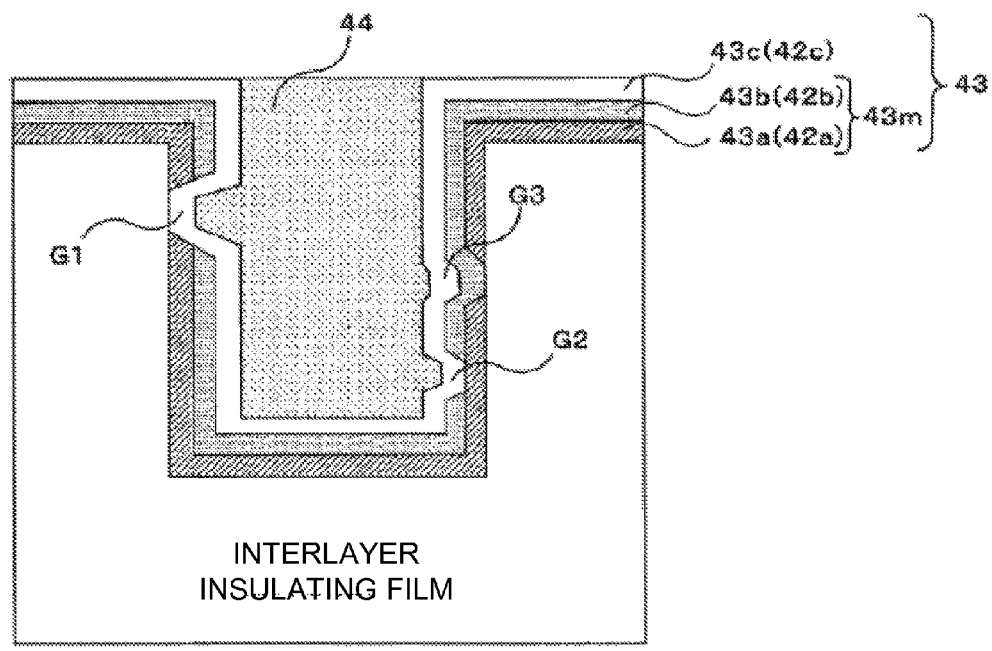
FIG. 4 depicts a schematic diagram of gap sections occurred in the multilayer section of the copper interconnection described in the fifth embodiment.

As shown schematically in FIG. 4, using the common cross-sectional TEM examination, it is observed that there are gap sections (G1-G3) on the portion 43m, from the multilayer structure 43. The portion 43m is formed from the titanium nitride thin layer 43a and the titanium thin layer 43b after applying the heat treatment. In some cases, such as the gap section G1 in FIG. 4, the gap is occurred on both layers including the titanium nitride thin layer 43a and the titanium thin layer 43b. As for the case of the gap section G2, resulted from the discontinuity of the titanium thin layer 42b, which is the upper layer of the multilayer structure 43m, before applying the heat treatment. Further, in this embodiment, the gap section G3 is also observed, which is resulted from the discontinuity of the titanium nitride thin layer 42a, the lower layer of the multilayer structure 43m, before applying the heat treatment. In any of those above-mentioned gap sections G1-G3, the thickness of both layers, the titanium nitride thin layer 42a and the titanium thin layer 42b, are set to be thin in order to maximize the opening width of the narrow interconnection groove. More specifically, in this embodiment, the thickness of the titanium nitride layer 42a is set to be about 3 nm while the thickness of the titanium layer 42b is set to be thinner, about 2 nm. The fact that the titanium nitride thin layer 42a and the titanium thin layer 42b do not have sufficient thickness for forming continuous layers is recognized as the main reason for creating the gap sections in the multilayer structure.

Among the gap sections G1 to G3, the manganese oxide layer 43c is formed on the gap sections G1 and G2 that have opening to the outside. As shown in FIG. 4, the manganese oxide layer 43c mainly contains manganese oxide (II) and it is formed so as to bury the gap sections G1 and G2. The gap section G2 is occurred due to the discontinuity of the titanium thin layer 43b, which is the upper layer of the multilayer structure 43m. The manganese oxide layer 43c (diffusion barrier layer 43) is contacted with and formed on the gap section G2 so as to cover the surface of the titanium nitride thin layer 43a (the exposed lower layer). Especially, on the gap section G1, the manganese oxide layer 43, made of manganese oxide (II), is formed so as to make contact directly with the insulating layer 40, e.g. SiOC, which is exposed to the gap section G1. The gap section G1 is occurred due to discontinuity of both the titanium nitride thin layer 43a and the titanium thin layer 43b. The occurrence of such gap sections G1 to G3 is also recognized when the multilayer structure is configured from tantalum nitride/tantalum series as described above in the fourth embodiment 4. Similar to the case of the fifth embodiment, the gap sections are also covered by the manganese oxide layer, containing manganese oxide (II), MnO.

The adhesiveness or the bonding strength is also evaluated, in this embodiment, using an experimental sample having the same structure as the one described in the fifth embodiment. That is, the structure body of the experimental sample consisting of the SiOC layer with the thickness of about 200 nm, the titanium nitride layer with the thickness of about 3 nm, the titanium layer with the thickness of about 2 nm, manganese oxide layer (II) MnO, and the copper plating layer with the thickness of about 200 nm, which are all provided in series on the {001}-silicon substrate. As a result of this measurement, the adhesiveness between the manganese oxide layer 43c (FIG. 4), made of manganese oxide (II), MnO, and the copper interconnection body 44 is evaluated to be 8 kg/cm$^2$. As described above, the diffusion barrier layer 43, which is mainly composed of manganese oxide (II), is present in the gap sections occurred on the titanium nitride layer (thickness of about 3 nm) and the titanium layer (thickness of about 2 nm). That is, the copper interconnection body 44 may be formed using the manganese oxide layer ($Mn_xO_y$, y/x<2), which is superior in the adhesiveness with copper, as the underlying layer even though the gap sections are present.

The electric resistivity is measured by the direct-current four-probe method. Even though the gaps are present, the electric resistivity of the copper interconnection body 44 is 2.2 μΩ·cm which is equivalent to the case of the copper interconnection structure provided with the diffusion barrier layer, formed from the copper manganese alloy layer, as described above in the first embodiment. Even though there are gaps in the titanium nitride and titanium thin layers, especially the gap section G1 which is exposed to the interlayer insulating layer 40 (FIG. 4), the manganese oxide layer (II) or the diffusion barrier layer is present so as to cover the surface of the exposed insulating layer. Therefore, it is thought that the composing elements of the interlayer insulating layer 40 (SiOC) are prevented from mixing into the interconnection body 44 and therefore it results in the low electric resistivity in close agreement with the pure bulk copper.

Embodiment 6

The sixth embodiment of the present invention is explained with reference to FIG. 5 using an example, in which the damascene type copper interconnection structure is provided with the double diffusion barrier layer formed from tantalum series and copper-manganese (Cu—Mn) alloy material.

Figure 5:
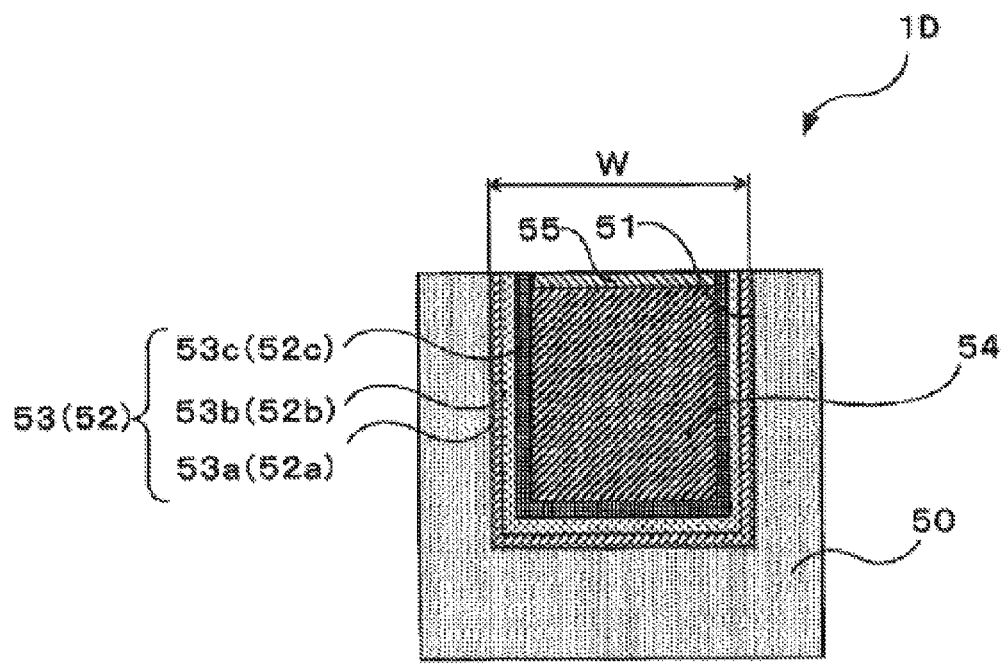
FIG. 5 illustrates a cross-sectional view of another alternative embodiment of a copper interconnection structure.

FIG. 5 illustrates a cross-sectional view of another alternative embodiment of a copper interconnection structure. As shown in this figure and similar to the fourth embodiment, a trench form interconnection groove 51 with an opening width of, W, 45 nm is formed in a SiOC insulating layer 50 with a thickness of 300 nm. Then, onto the surface of the insulating layer 50, including the inner surface of the interconnection groove 51, a tantalum nitride (TaN) layer 52a with a thickness of about 3 nm is first deposited by the common reactive ion sputtering method using the nitride gas ($N_2$) as the nitride source. Next, onto the tantalum nitride thin layer 52a, a tantalum thin layer 52b with a thickness of about 2 nm) is deposited by the common high-frequency sputtering method.

Thereafter, onto the tantalum thin layer 52b, a copper manganese alloy film 52c with a thickness of about 2 nm), which contains 4% of manganese in atomic concentration, is deposited by the common high-frequency sputtering method. This copper manganese alloy film 52c is made from an alloy of high-purity oxygen-free copper (6N) and high-purity manganese (5N) materials. In addition, the copper-manganese alloy layer 52c is formed using an alloy target material in which total contents of impurities, such as lithium (Li), calcium (Ca), magnesium (Mg), iron (Fe), nickel (Ni), lanthanum (La), or cesium (Ce), is not more than 0.1% in atomic concentration (refer to Japanese Patent No. 4065019).

Next, the multilayer structure 52 is heated for 10 minutes at a temperature of about 520° C. in a vacuum atmosphere with the pressure of 2×10$^{-3}$ Pa, thereby forming the diffusion barrier layer 53. This diffusion barrier layer 53 is formed from the tantalum nitride thin layer 53a, the tantalum thin layer 53b, and the manganese oxide layer 53c. The manganese oxide layer 53c is the layer obtained by heat treating the copper manganese alloy layer 52c. The bonding region between the tantalum thin layer 53b and the manganese oxide layer 53c, which is obtained by the heat treatment process, is mainly composed of manganese oxide (II) with the following composition: MnO.

Onto the surface of the diffusion barrier layer 53, copper representing the interconnection body 54 is deposited by an electrolytic plating method so as to fill the inside of the interconnection groove 51. Thereafter, copper which is excessively formed on the interconnection groove 51 and the diffusion barrier layer 53 remained on the insulating layer 50 are removed by the chemical and mechanical polishing (CMP) method until the surface of the insulating layer 50 is exposed.

Then, another heat treatment is performed in an argon (Ar) gas atmosphere, which contains 2 vol.ppm of oxygen ($O_2$) in volume concentration, for forming a second manganese oxide layer on the opening surface of the interconnection body 54. The heating is performed for 25 minutes at a temperature of about 300° C. Thereby, a manganese oxide layer 55 is formed on the opening surface side of the interconnection body 54. Therefore, a damascene type copper interconnection structure 1D is completed by applying this heat treatment.

The cross-sectional TEM examination shows the presence of gaps (discontinuous section) in a partial region of the diffusion barrier layer 53. These gaps are occurred due to the fact that the tantalum nitride thin layer 52a and the tantalum thin layer 52b do not have the sufficient thickness for forming a continuous layer. Even in the discontinuous sections, the manganese oxide layer 53c is formed so as to fill up the gaps in discontinuous sections. It is also shown that, in some situations, the manganese oxide layer 53c, MnO, is formed so as to contact directly with the SiOC insulating film 50, which is exposed in the gaps created in the discontinuous sections.

The composition of manganese oxide of the diffusion barrier layer 53 and the surface of the manganese oxide layer 55 is analyzed by the X-ray photoelectron spectroscopy (XPS) method. It is shown that the manganese oxide layer 53c is mainly composed of manganese oxide (II) with the following composition: MnO having the compositional ratio of oxygen to manganese equal to 1. Further, it is shown that the surface of the manganese oxide layer 55 is mainly composed of the manganese oxide (III) with the following composition formula: $Mn_2O_3$, (y/x=1.5). That is, it is shown that the surface of the manganese oxide layer 55, formed on the opening surface of the copper interconnection structure 1D, is mainly composed of manganese oxide (III) with the compositional ratio of oxygen to manganese y/x equal to 1.5. Therefore, the valence becomes larger than the manganese oxide (manganese oxide (II)) layer 53c constituting the diffusion barrier layer 53.

The amount of impurities mixed into the manganese oxide layer 53c, of the diffusion barrier layer 53, and into the surface of the manganese oxide layer 55 is compared using the common SIMS and AES analysis in combination. The atomic concentration of silicon is $2 \times 10^{19}$ $cm^{-3}$ at maximum in the manganese oxide layer 53c. The silicon is inferred to be withdrawn from the SiOC of the interlayer insulating layer film 50 and intrude into the diffusion barrier layer 53. Meanwhile, the concentration of silicon in the surface of the manganese oxide layer 55 is $7 \times 10^{17}$ $cm^{-3}$ at maximum.

Separately, the structure body in which the SiOC layer with the thickness of about 200 nm, the tantalum nitride layer with the thickness of about 3 nm, the tantalum layer with the thickness of about 2 nm, the manganese oxide layer (II), MnO, and the copper plating layer with the thickness of about 200 nm are provided in series on the {001}-silicon substrate. Thereafter, the manganese oxide layer, made of manganese oxide (III) ($Mn_2O_3$), is formed by oxidizing the surface of the copper plating layer under the same condition as those described above. The adhesive strength is examined using this experimental sample. It is found that the adhesiveness between the manganese oxide layer, made of manganese oxide (II), MnO, and the copper interconnection body is favorable even the oxidization treatment is performed for forming the second manganese oxide layer, made of manganese oxide (III), $Mn_2O_3$, on the surface of the copper plating layer. The adhesive strength is evaluated to be about 7 kg/$cm^2$.

Similar to the case of the first to third embodiments, the electric resistivity of the copper interconnection body is measured by the direct current four-probe method. The electric resistivity of the copper interconnection body is 2.0 μΩ·cm at room temperature which is in close proximity to the electric resistivity of pure bulk copper (1.7 μΩ·cm).

Embodiment 7

A trench form interconnection groove is formed in an interlayer insulating layer made from silicon oxide carbide (SiOC) layer with a thickness of 200 nm. The opening width of the interconnection groove is set to be about 32 nm. As described above in the first embodiment, copper 96% manganese 4% alloy layer is deposited onto the surface of the insulating layer, including the inner and upper surface side of the interconnection groove using the common high-frequency sputtering method. The thickness of the copper manganese 4% alloy film is set to be about 4 nm.

Thereafter, the copper manganese alloy layer is heated for 20 minutes at a temperature of about 350° C. in an argon atmosphere containing hydrogen. For 10 minutes after starting the heat treatment process, the parts per million volume fraction (vol.ppm) of hydrogen in the argon atmosphere is set to 2 vol.ppm. After 10 minutes elapsed from the start of the heat treatment process, the parts per million volume fraction of hydrogen is increased gradually to 5 vol.ppm. Thereby, the diffusion barrier layer made of manganese oxide is formed.

Next, copper constituting the interconnection body is deposited on the surface of the diffusion barrier layer by the electrolytic plating method so as to bury inside of the interconnection groove. Thereby, a single damascene type copper interconnection structure is formed.

Manganese oxide of the diffusion barrier layer is identified using the X-ray energy dispersive spectroscopy (EDS) device attached to a field emission scanning electron microscopy (Phillips FE-TEM CM200 type). A manganese oxide layer containing a large amount of manganese oxide (III), $Mn_2O_3$, is formed in the region to bond with the diffusion barrier layer tantalum film by the heat treatment in which the hydrogen concentration in the atmosphere is changed with time. Further, a manganese oxide layer, which contains a large amount of manganese oxide (II) (MnO), is formed on the surface side of the copper manganese alloy layer. The thicknesses of the manganese oxide layer, which contains a large amount of manganese oxide (III) and the manganese oxide layer, which contains large amount of manganese oxide (II) are roughly equal to 2 nm.

Separately, tantalum nitride film, tantalum film and copper manganese alloy film with the above-described atomic concentration of manganese and the thicknesses are deposited on the SiOC layer with the thickness of about 200 nm formed on the {001}-silicon substrate to form the diffusion barrier layer by gradually changing the volume concentration of hydrogen in the atmosphere. Thereafter, the copper plating layer with the thickness of about 200 nm is formed. The adhesiveness or bonding strength is evaluated using this structure body as the experimental sample. As a result, the adhesiveness of the diffusion barrier layer which is structured from manganese oxide (III), $Mn_2O_3$, inside and manganese oxide (II) (MnO) on the surface side, and the copper interconnection body is favorable. The adhesive strength is evaluated to be about 8 kg/$cm^2$.

Further, the electric resistivity of the copper interconnection body is measured at room temperature using the direct current four-probe method. As a result of this measurement, the resistivity of the copper interconnection body is about 2.2 μΩ·cm, which is close to the electric resistivity of pure bulk copper.

Comparative Example

Exactly the same as the first embodiment described above, a copper (96%) manganese (4%) alloy layer with the thickness of about 2 nm is formed on a SiOC insulating layer.

Unlike the case of the first embodiment, the heat treatment is performed for 20 minutes at a temperature of about 350° C. in argon (Ar) atmosphere with atmospheric pressure, instead of vacuum atmosphere or inert gas atmosphere containing reducing gas. The EELS analysis shows that the diffusion barrier layer containing manganese oxide (IV) ($MnO_2$) is formed in the bonding region with the interlayer insulating layer.

Next, copper is deposited onto the surface of the diffusion barrier layer by the electrolytic plating method so as to bury inside of the interconnection groove. The electric resistivity of the copper interconnection body measured by the direct current four-probe method is 2.2 μΩ·cm, which has no big difference from the case of the first embodiment.

Meanwhile, a structure body in which the SiOC layer with the thickness of about 200 nm), $Mn_2O_3$ layer, and the copper plating layer with the thickness of about 250 nm are provided on a {001}-silicon substrate in series, formed as the experimental sample. The peel test result of this sample shows that the adhesiveness of the diffusion barrier layer and the copper interconnection body is about 6 kilogram (kg)/$cm^2$, which is lower than the first embodiment.

According to the present invention, bidirectional diffusion, the diffusion of compositional material or impurities of the insulating layer into the copper interconnection body from the insulating layer, and the diffusion of Cu in the copper interconnection into the insulating layer, can be prevented when forming a barrier layer of Mn and oxygen, which has a barrier action against atomic diffusion of impurities, such as Cu or others atoms, by heat treating the copper alloy layer, which is a material of the barrier layer. The prevention of the diffusion is possible even in the case where further depositing an insulating film and the like on the surface and side faces of the copper interconnection provided with the barrier layer in addition to the surface of the material constitutes the copper interconnection, such as a Cu buried layer, which is exposed and opened to the atmosphere of the heat treatment. Therefore, it is possible to structure semiconductor devices provided with copper interconnections low in electric resistance, such as low-power consumption liquid crystal display devices (LCD), flat-panel display devices (FDP), organic electroluminescence (EL) devices, and inorganic EL devices.

Because the barrier layer of the present invention may be formed without losing smoothness of the surface of the material that structures the copper interconnection body, such as Cu buried layer, the copper interconnection may be formed by further layering on this barrier layer, for example. It is, therefore, possible to structure semiconductor devices, such as large-scale system LSI with, for example, multilayered copper interconnection in which the interconnection width is set to 40 nm or less.

What is claimed is:

1. A method for forming a copper interconnection structure, the method comprising the steps of:
    forming an insulating layer over a main body;
    forming a copper layer including manganese on the insulating layer;
    annealing the copper layer including manganese so as to form a diffusion barrier layer, wherein the annealing step is applied:
        in a vacuum atmosphere with a pressure of not more than 0.1 Pa,
        at temperatures ranging from 350° C. to 550° C., and
        for a time period ranging from 5 to 80 minutes; and
    depositing copper over the diffusion barrier layer so as to form an interconnection body, wherein the diffusion barrier layer comprises an oxide layer including manganese having a compositional ratio of oxygen to manganese (y/x) less than 2;
    further comprising a step of annealing an upper surface of the interconnection body after the depositing step so as to form a second oxide layer on the upper surface of the interconnection body;
    wherein a compositional ratio of oxygen to manganese in the second oxide layer (y1/x1) is greater than the compositional ratio of oxygen to manganese in the diffusion barrier layer (y/x).

2. The method as recited in claim 1, wherein the copper layer including manganese is formed from copper alloy.

3. The method as recited in claim 1, wherein the copper layer including manganese has a multilayer structure.

4. The method as recited in claim 3, wherein the multilayer structure comprises: a first layer comprising manganese formed on the insulating layer, and a second layer comprising copper deposited over the first layer.

5. The method as recited in claim 1, further comprising a step of forming a layer comprising a metal element other than manganese on the insulating layer before forming the copper layer including manganese.

6. The method as recited in claim 5, wherein the layer comprising the metal element is an oxide layer or a nitride layer of the metal element.

7. The method as recited in claim 5, wherein an enthalpy of oxide formation for the metal element is lower than the enthalpy of oxide formation for copper.

8. The method as recited in claim 5, wherein an enthalpy of oxide formation for the metal element is lower than the enthalpy of oxide formation for silicon.

9. The method as recited in claim 5, wherein the metal element comprises tantalum or titanium.

10. The method as recited in claim 1, wherein the step of annealing the upper surface of the interconnection body is applied:
    in an inert gas including oxygen at a ratio ranging from 0.5 vol. ppm to 10 vol. ppm,
    at temperatures ranging from 250° C. to 550° C., and
    for a time period ranging from 5 to 80 minutes.

11. The method as recited in claim 1, wherein the compositional ratio of oxygen to manganese in the second oxide layer (y1/x1) is more than 1 and less than 2.

12. The method as recited in claim 11, wherein each of said diffusion barrier layer and second oxide layer further comprises a metal element selected from the group consisting of silicon, ruthenium and hafnium.

13. The method as recited in claim 12, wherein a total amount of metal element in the second oxide layer is smaller than the total amount of metal element in the diffusion barrier layer.

* * * * *